(12) United States Patent
Chen

(10) Patent No.: US 6,396,697 B1
(45) Date of Patent: May 28, 2002

(54) HEAT DISSIPATION ASSEMBLY

(75) Inventor: Yun Lung Chen, Taipei (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/746,407

(22) Filed: Dec. 20, 2000

(30) Foreign Application Priority Data

Dec. 7, 2000 (TW) ..................................... 089221276 U

(51) Int. Cl.⁷ ................................................ H05K 7/20
(52) U.S. Cl. ...................... 361/704; 361/707; 361/709; 361/695; 361/710; 165/80.3; 174/16.1; 174/16.3; 257/718; 257/719; 257/727
(58) Field of Search ................................ 361/690, 695, 361/704, 707, 709, 710; 257/706, 718, 719, 722, 727; 174/16.1, 16.3; 165/80.1, 80.2, 80.3, 185

(56) References Cited

U.S. PATENT DOCUMENTS 5,373,099 A * 12/1994 Boitard et al. ............. 174/16.3
5,594,623 A * 1/1997 Schwegler .................. 361/697
5,706,169 A * 1/1998 Yeh ............................ 361/690
5,864,464 A * 1/1999 Lin ............................ 361/697
6,017,185 A * 1/2000 Kuo ........................... 415/177
6,062,301 A * 5/2000 Lu .............................. 165/80.3

* cited by examiner

Primary Examiner—Leo P. Picard
Assistant Examiner—Boris L. Chervinsky
(74) Attorney, Agent, or Firm—Wei Te Chung

(57) ABSTRACT

A heat dissipation assembly includes a fan (10), a heat sink (20) and a holder (40) attaching the fan on the heat sink. The fan defines four through holes (104) at four corners thereof. The heat sink includes a base (201) with two grooves (205) defined thereunder, and a plurality of fins (202) attached on the base. The fins define a channel (204) there though. The holder includes two identical and opposing holder members (409). Each member includes a flange (402) with a vertical tab (404) for extending into one corresponding through hole of the fan, and a screw hole (403) for engaging with a screw (102) which extends through another corresponding through hole. Each member has two horizontal tabs (408) for inserting into the grooves of the base. Each member defines an opening (406) in alignment with the channel, for accommodating a heat sink clip (30).

3 Claims, 4 Drawing Sheets

HEAT DISSIPATION ASSEMBLY

BACKGROUND OF THE INVENTION

1. Field of the Invention

The present invention relates to a heat dissipation assembly, and more particularly to a heat dissipation assembly which can be readily and securely assembled together.

2. Related Art

Electronic devices such as central processing units (CPUs) generate a lot of heat during normal operation. This can deteriorate their operational stability and damage associated electronic devices. Thus the heat must be removed quickly to ensure normal operation. A heat dissipation device is often attached to a top surface of a CPU. to remove heat therefrom.

A conventional heat dissipation device is formed by extrusion, which significantly limits the height of its formed fins. Furthermore, to meet increasing demands for dissipation of ever-increasing amounts of heat, larger and larger heat dissipation devices are being manufactured. This results in excessively heavy heat dissipation devices which are unwieldy and prone to be unstable.

To resolve the above-mentioned problems, another kind of heat dissipation device has been developed. The fins of such device are folded from a metal sheet. The device has a large heat dissipation surface area. However, because the fins are folded from a metal sheet, a cooling fan cannot be easily and securely attached to the fins. The device generally removes heat without the benefit of a fan. This limits heat conduction, thereby reducing the efficiency of heat transfer. Thus the device does not reliably remove heat from a CPU.

An improved heat dissipation assembly which overcomes the above-mentioned problems is strongly desired.

SUMMARY OF THE INVENTION

Accordingly, an object of the present invention is to provide a heat dissipation assembly which can be readily and securely assembled together.

To achieve the above object, a heat dissipation assembly in accordance with the present invention comprises a fan, a heat sink and a holder attaching the fan on the heat sink. The fan is box-shaped and defines four through holes at four corners thereof respectively. The heat sink comprises a base with two grooves defined thereunder, and a plurality of fins attached on the base. The fins define a channel therethrough. The holder comprises two identical and opposing holder members. Each member has a flange extending perpendicularly from a top edge thereof. Each flange comprises a vertical tab for extending into the corresponding through hole of the fan, and a screw hole for engaging with a screw which extends through another corresponding through hole of the fan. The fan is thereby secured to the holder. Each member has two horizontal tabs for inserting into the grooves of the base, whereby the members arc secured at opposite sides of the base. Each member defines an opening in alignment with the channel of the fins, for accommodating a heat sink clip.

Other objects, advantages and novel features of the present invention will be drawn from the following detailed embodiment of the present invention with attached drawings, in which:

DETAILED DESCRIPTION OF THE PREFERRED EMBODIMENT

Figure 1:
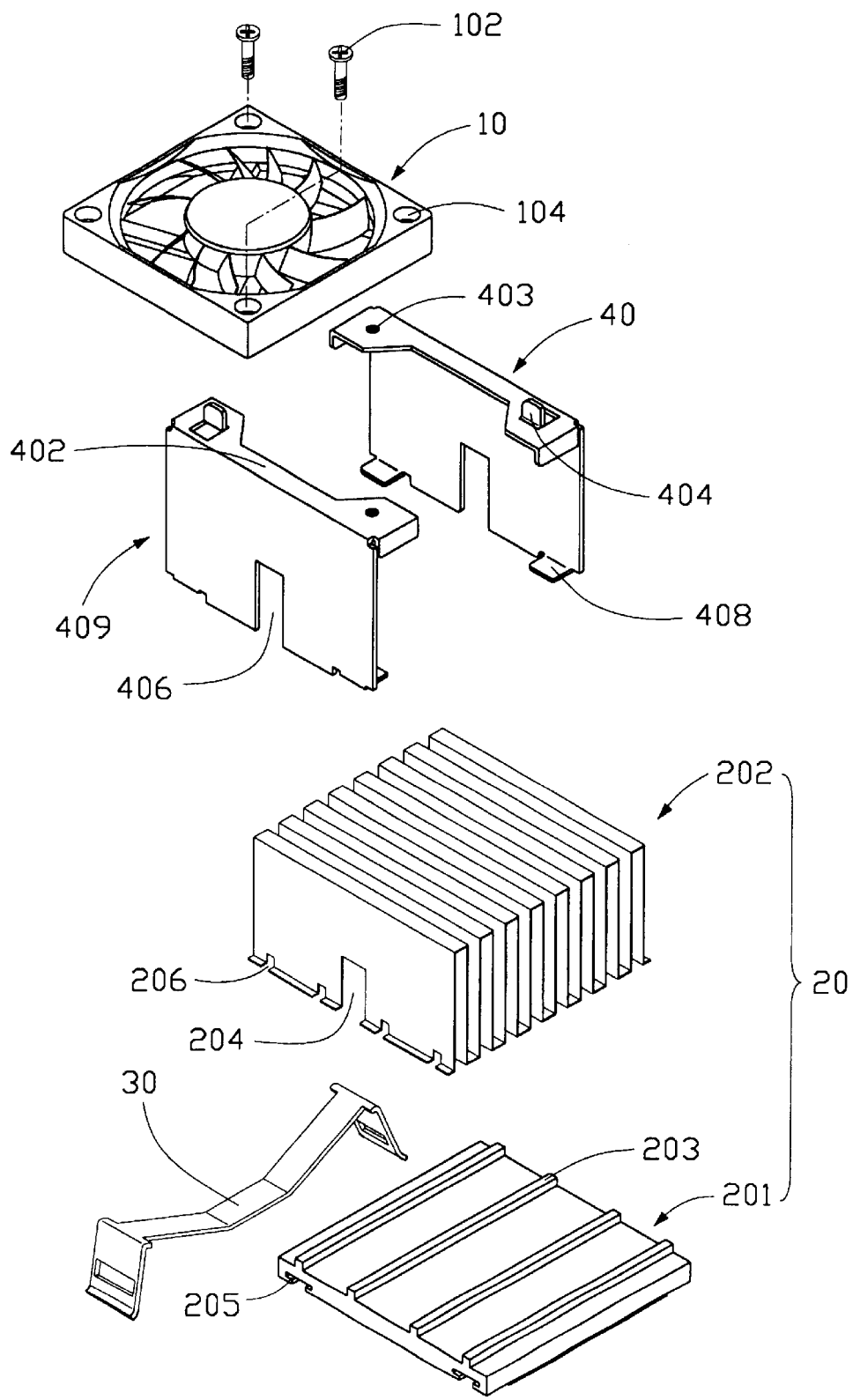
FIG. 1 is an exploded view of a heat dissipation assembly in accordance with the present invention together with a heat sink clip.

Referring to FIG. 1, a heat dissipation assembly in accordance with the present invention comprises a fan 10, a heat sink 20, and a holder 40. The assembly accommodates a heat sink clip 30 therein.

The fan 10 is box-shaped and defines four through holes 104 at four corners thereof respectively.

The heat sink 20 comprises a base 201 and a plurality of folded fins 202. A plurality of parallel ribs 203 is formed on a top surface of the base 201. A pair of T-shaped grooves 205 is defined in a bottom surface of the base 201, near respective opposite sides of the base 201 and parallel to the ribs 203. A transverse channel 204 is defined through bottom surfaces of the fins 202, for accommodating the clip 30. A plurality of slots 206 is defined through the bottom surfaces of the fins 202 parallel to the channel 204, corresponding to the ribs 203 of the base 201.

Figure 2:
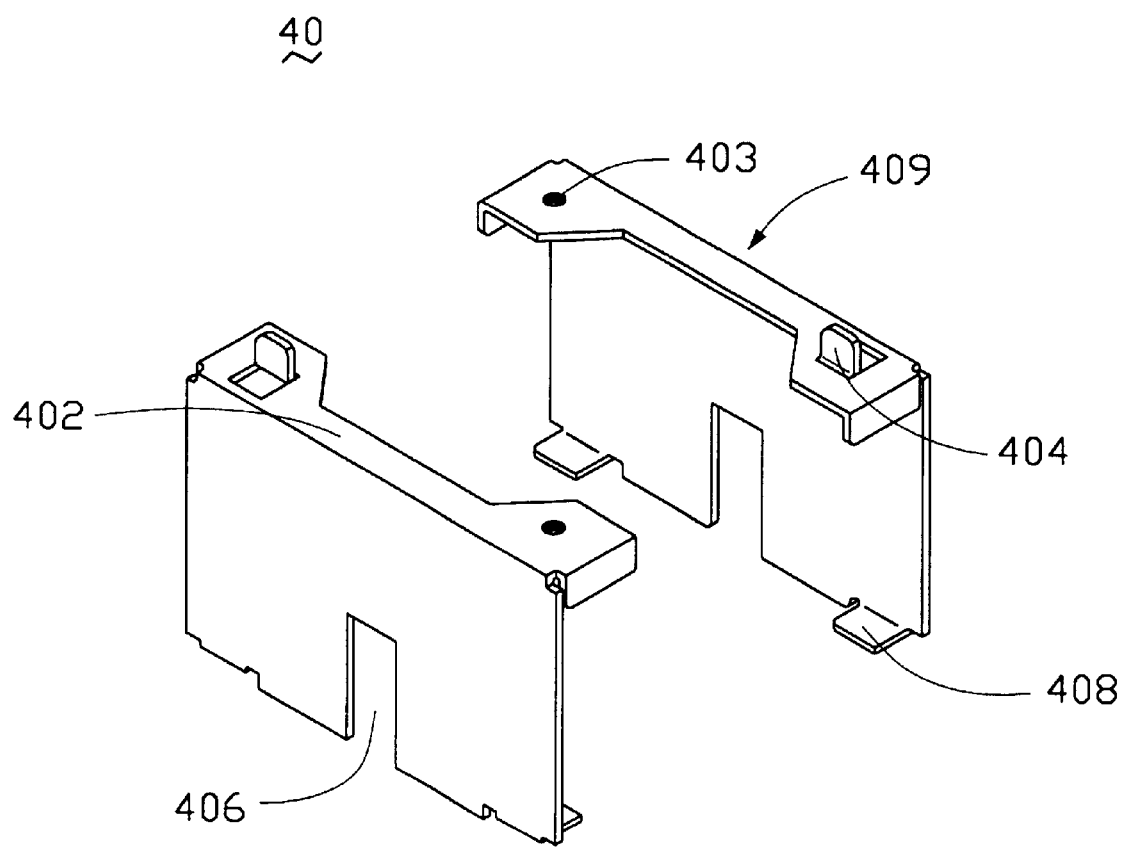
FIG. 2 is a perspective view of a fan holder of FIG. 1.

Referring also to FIG. 2, the holder 40 comprises two identical holder members 409. A pair of flanges 402 respectively extends perpendicularly inwardly toward each other from top edges of the members 409. A pair of vertical tabs 404 is respectively stamped upwardly from two diagonally opposite ends of the flanges 402, for extending into the corresponding through holes 104 of the fan 10. A pair of screw holes 403 is respectively defined in the other two diagonally opposite ends of the flanges 402, for respectively engaging with a pair of screws 102 which extend through the corresponding through holes 104 of the fan 10. An opening 406 is defined in a lower central portion of each member 409, corresponding to the channel 204 of the heat sink 20. A pair of horizontal tabs 408 respectively extends perpendicularly inwardly at opposite ends of a bottom edge of each member 409, for inserting into the corresponding grooves 205 of the heat sink 20.

Figure 3:
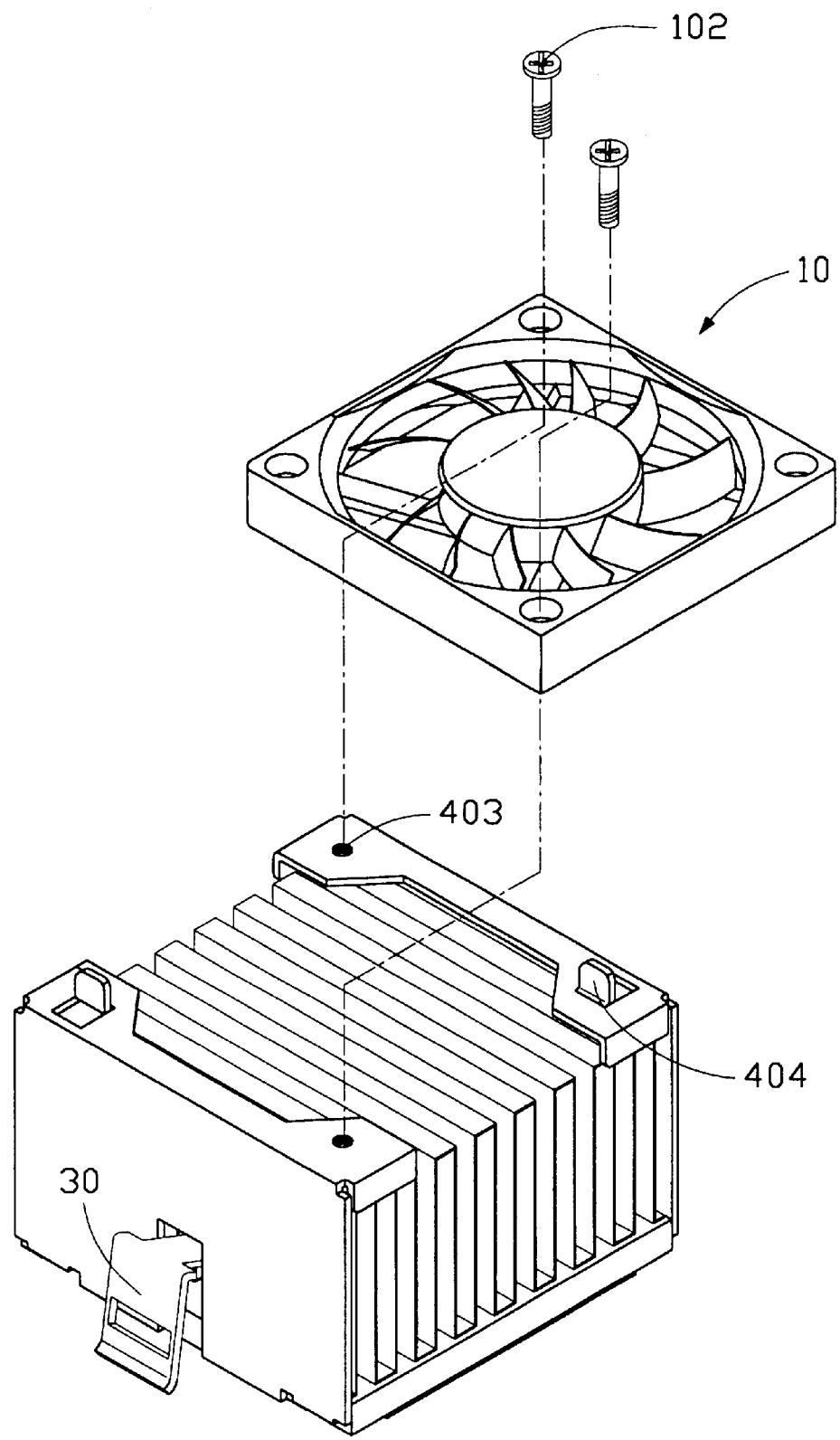
FIG. 3 is a partly assembled view of FIG. 1.
Figure 4:
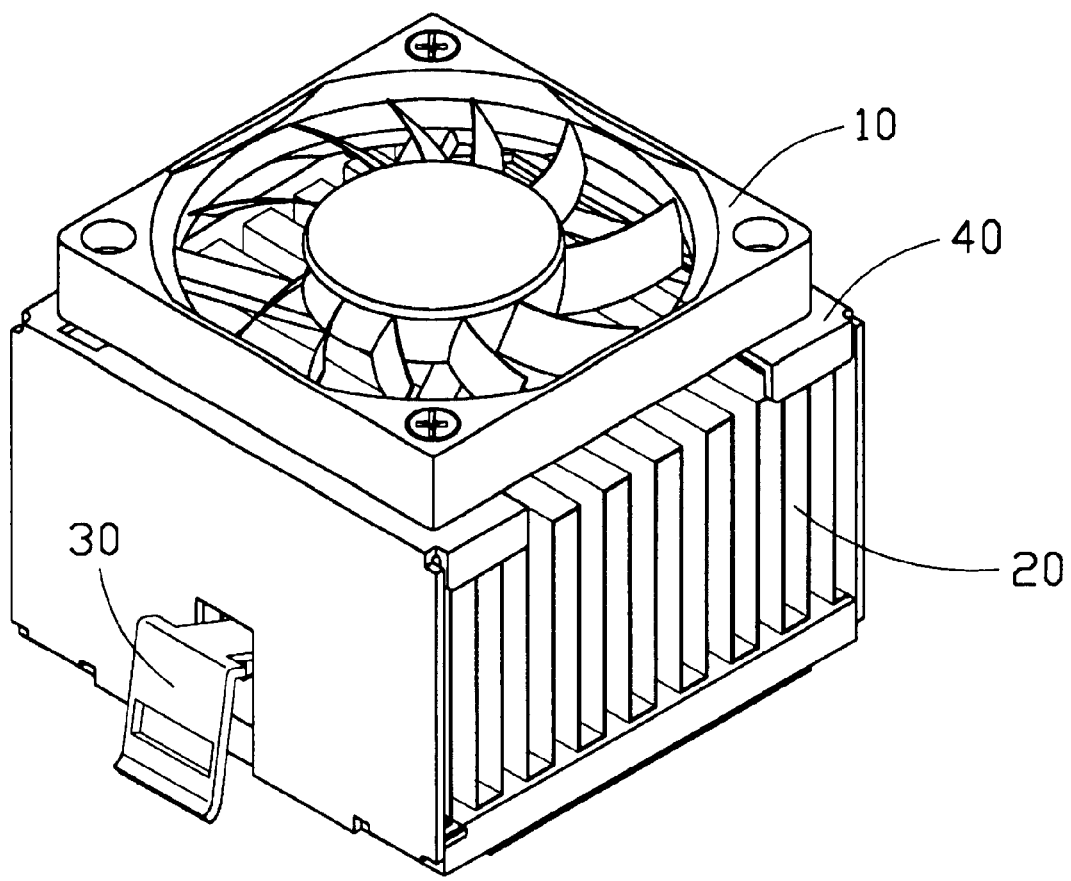
FIG. 4 is a completely assembled view of FIG. 1.

Referring also to FIGS. 3 and 4, in assembly, the clip 30 is placed on the base 201 parallel to and between the innermost ribs 203 of the base 201. The fins 202 are then attached to the base 201, with the slots 206 of the folded fins 202 interferentially engaging with the ribs 203 of the base 201. The clip 30 is thus accommodated in the channel 204 of the fins 202. The two members 409 of the holder 40 are then attached on opposite sides of the fins 202 respectively. The horizontal tabs 408 of the members 409 are respectively inserted into the corresponding grooves 205 of the base 201. The clip 30 thus extends through the openings 406 of the members 409. The fan 10 is then placed on the holder 40. Two diagonally opposite through holes 104 of the fan 10 receive the corresponding vertical tabs 404 of the holder 40, to position the fan 10 on the holder 40. The other two diagonally opposite through holes 104 align with the corresponding screw holes 403 of the members 409. The two screws 102 are then respectively extended through the corresponding diagonally opposite through holes 104 of the fan 10, to engage with the screw holes 403 of the holder 40. Thus the fan 10 is readily attached to the top of the fins 202, and the heat dissipation assembly is ready for use as a single unit. Such unit can, for example, be attached to a central processing unit for transferring heat therefrom.

It is understood that the invention may be embodied in other forms without departing from the spirit thereof. Thus, the present examples and embodiment are to be considered in all respects as illustrative and not restrictive, and the invention is not be limited to the details given herein.

What is claimed is:

1. A heat dissipation assembly comprising;
   a heat sink adapted for removing heat form a heat-generating electronic device, the heat sink comprising a base with at least one groove defined in a bottom surface thereof and a plurality of folded fins attached to the base;
   a fan adapted for facilitating heat dissipation; and
   a holder attaching the fan on the heat sink, the holder having at least two horizontal tabs respectively extending inwardly from bottom edges of the holders for engaging with the at least one groove to prevent vertical movement of the holder relative to the base thereby securing the holder on the base; wherein
      the holder comprises two identical holder members which are respectively attached on opposite sides of the base of the heat sink;
      wherein
         the fan defines four through holes therein, and each member of the holder comprises a vertical tab adapted for being received in one corresponding through hole of the fan, and a screw hole for engagements with a screw which extends through another corresponding through hole of the fan, thereby securing the fan on the holder:
      wherein
         before assembled, the base of the heat sink and the folded fins are discrete with each other, and when assembled, ribs of the base of the heat sink interfere within corresponding slots of the folded fins, thereby securing the folded fins to the base.

2. The heat dissipation assembly as recited in claim 1, wherein each member of the holder comprises a flange extending from a top edge of the member, and wherein the vertical tab and the screw hole are respectively formed at opposite ends of the flange.

3. The heat dissipation assembly as recited in claim 1, wherein the fins of the heat sink define a channel therethrough, and each member of the holder defines an opening in alignment with the channel, for accommodating a heat sink clip.

* * * * *